(12) United States Patent
Chen (10) Patent No.: US 8,787,515 B2
(45) Date of Patent: Jul. 22, 2014

(54) CLOCK DATA RECOVERY CIRCUIT

(75) Inventor: An-Chung Chen, Hsinchu (TW)

(73) Assignee: Phison Electronics Corp., Miaoli (TW)

( * ) Notice: Subject to any disclaimer, the term of this patent is extended or adjusted under 35 U.S.C. 154(b) by 197 days.

(21) Appl. No.: 13/308,499

(22) Filed: Nov. 30, 2011

(65) Prior Publication Data

US 2013/0107997 A1 May 2, 2013

(30) Foreign Application Priority Data

Oct. 28, 2011 (TW) .............................. 100139392 A (51) Int. Cl.
  *H03D 3/24* (2006.01)
(52) U.S. Cl.
  USPC .......................................... 375/376; 327/141
(58) Field of Classification Search
  USPC .......................................................... 375/376
  See application file for complete search history.

(56) References Cited

U.S. PATENT DOCUMENTS

| | | | |
|---|---|---|---|
| 6,512,473 B2* | 1/2003 | Sasaki ............................ | 341/159 |
| 7,366,271 B2* | 4/2008 | Kim et al. ...................... | 375/376 |
| 7,577,225 B2* | 8/2009 | Azadet et al. .................. | 375/373 |
| 8,170,169 B2* | 5/2012 | Martin et al. ................... | 375/373 |
| 2004/0258188 A1* | 12/2004 | Kim et al. ....................... | 375/376 |
| 2005/0285688 A1* | 12/2005 | Hirano et al. .................... | 331/16 |
| 2008/0080655 A1* | 4/2008 | Gilliland et al. ............... | 375/376 |
| 2008/0130816 A1* | 6/2008 | Martin et al. ................... | 375/373 |
| 2009/0085679 A1* | 4/2009 | Jennings et al. ............... | 331/1 A |
| 2009/0276195 A1* | 11/2009 | Bouaricha ......................... | 703/2 |
| 2010/0097150 A1* | 4/2010 | Ueda et al. ...................... | 331/25 |
| 2011/0148484 A1* | 6/2011 | Kim et al. ....................... | 327/148 |
| 2012/0213265 A1* | 8/2012 | Wu ................................ | 375/226 |

* cited by examiner

*Primary Examiner* — Santiago Garcia
(74) *Attorney, Agent, or Firm* — Jianq Chyun IP Office (57) ABSTRACT

A clock and data recovery (CDR) circuit having a phase locked module and a frequency locked module is provided. A phase detector of the phase locked module compares a phase of an input data stream with a phase of a data-recovery clock to output an adjusting signal. The frequency locked module performs a first-order integration process and a second-order integration process on the adjusting signal to generate a first integration error and a frequency control signal. The phase locked module generates a phase control signal according to the first integration error and the adjusting signal. An oscillation circuit of the frequency locked module generates at least one reference clock according to the frequency control signal. A phase converter of the phase locked module outputs the data-recovery clock to the phase detector according to the phase control signal and the reference clock.

18 Claims, 12 Drawing Sheets

CLOCK DATA RECOVERY CIRCUIT

CROSS-REFERENCE TO RELATED APPLICATION

This application claims the priority benefit of Taiwan application serial no. 100139392, filed on Oct. 28, 2011. The entirety of the above-mentioned patent application is hereby incorporated by reference herein and made a part of this specification.

BACKGROUND OF THE INVENTION

1. Technology Field

The invention relates to a clock and data recovery circuit. Particularly, the invention relates to a clock and data recovery circuit capable of generating a reference clock signal based on a received input data stream.

2. Description of Related Art

Figure 1:
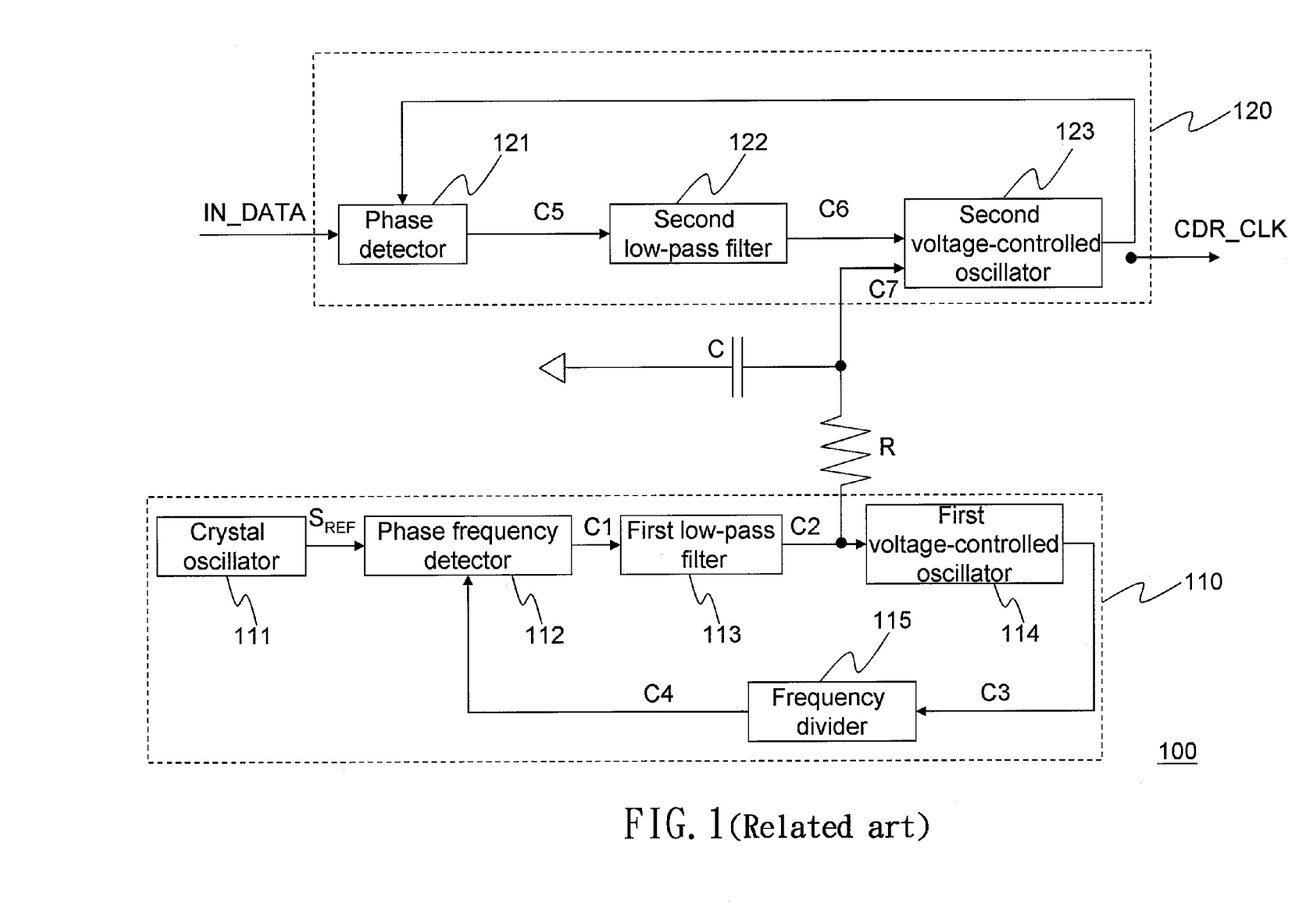
FIG. 1 is a structural diagram of a conventional clock and data recovery (CDR) circuit.

FIG. 1 is a structural diagram of a conventional clock and data recovery (CDR) circuit. The clock and data recovery circuit 100 includes a coarse-tuning module 110 and a fine-tuning module 120. The coarse-tuning module 110 is used for providing a coarse-tuning control voltage to the fine-tuning module 120, and the fine-tuning module 120 receives an input data stream IN_DATA, and outputs a data-recovery clock CDR_CLK.

The coarse-tuning module 110 has a crystal oscillator 111, a phase frequency detector 112, a first low-pass filter 113, a first voltage-controlled oscillator 114 and a frequency divider 115. The crystal oscillator 111 generates a reference clock $S_{REF}$ through crystal oscillation. The phase frequency detector 112 compares a phase of the reference clock $S_{REF}$ and a phase of a frequency-divided signal C4, and outputs a control signal C1 according to the comparison result. The first low-pass filter 113 filters the control signal C1 to output a control voltage C2. The first voltage-controlled oscillator 114 oscillates to generate an oscillation signal C3 according to the control voltage C2. The frequency divider 115 divides a frequency of the oscillation signal C3 and outputs the frequency-divided signal C4.

The fine-tuning module 120 has a phase detector 121, a second low-pass filter 122 and a second voltage-controlled oscillator 123. The phase detector 121 compares phases and frequencies of the input data stream IN_DATA and the data-recovery clock CDR_CLK, and outputs a control signal C5 according to the comparison result. The second low-pass filter 122 filters the control signal C5 to output a control voltage C6. After being processed by a resistor R and a capacitor C, the control voltage C2 output by the first low-pass filter 113 is converted into a control voltage C7. The second voltage-controlled oscillator 123 oscillates to generate the data-recovery clock CDR_CLK according to the control voltage C6 and the control voltage C7. The data-recovery lock CDR_CLK is transmitted to the phase detector 121.

The clock and data recovery circuit 100 recovers the input data stream IN_DATA according to the data-recovery clock CDR_CLK, so as to generate a retimed data stream. In some specific specifications, in order to ensure correctness of data recovered by the clock and data recovery circuit 100, jitter of the retimed data stream cannot be too large. Therefore, an error between a frequency of the reference clock $S_{REF}$ generated by the crystal oscillator 111 and a frequency of the input data stream IN_DATA has to be within a specific range. Taking a universal serial bus (USB) 3.0 as an example, the error between the frequency of the reference clock $S_{REF}$ and the frequency of the input data stream IN_DATA has to be smaller than 300 ppm (one ppm is equal to one of a million). Although a commercial crystal oscillator can generate a clock signal with a frequency error smaller than ±100 ppm to serve as an ideal clock signal source, such crystal oscillator is expensive and occupies a large circuit board space.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

Accordingly, the invention is directed to a clock and data recovery circuit, which is capable of generating a required reference clock according to a received input data stream without using an external crystal oscillator.

The invention provides a clock and data recovery (CDR) circuit including a phase detector, a first integration module, an operation unit, a second integration module, a third integration module, an oscillation circuit and a phase converter. The phase detector compares a phase of an input data stream with a phase of a data-recovery clock to output an adjusting signal. The first integration module is coupled to the phase detector, and performs an integration process on the adjusting signal to output a first integration phase error. The operation unit is coupled to the first integration module, and operates the first integration phase error and the adjusting signal to obtain an operation value. The second integration module is coupled to the operation unit, and performs an integration process on the operation value to output a phase control signal. The third integration module is coupled to the first integration module, and performs an integration process on the first integration phase error to output a frequency control signal. The oscillation circuit is coupled to the third integration module, and generates at least one reference clock according to the frequency control signal. The phase converter is coupled to the oscillation circuit, the second integration module and the phase detector, and outputs the data-recovery clock to the phase detector according to the phase control signal and the reference clock.

The invention provides a clock and data recovery (CDR) circuit including a phase detector, a first integration module, an operation unit, a second integration module, an oscillation circuit and a phase converter. The phase detector compares a phase of an input data stream with a phase of a data-recovery clock to output an adjusting signal. The first integration module is coupled to the phase detector, and performs an integration process on the adjusting signal to output a first integration phase error. The operation unit is coupled to the first integration module, and operates the first integration phase error and the adjusting signal to obtain an operation value. The second integration module is coupled to the operation unit, and performs an integration process on the operation value to output a phase control signal. The oscillation circuit is coupled to the second integration module, and generates at least one reference clock according to the first integration phase error. The phase converter is coupled to the oscillation circuit, the second integration module and the phase detector, and outputs the data-recovery clock to the phase detector according to the phase control signal and the reference clock.

According to the above descriptions, the CDR circuit of the invention is capable of generating the required reference clock according to the received input data stream without using an external crystal oscillator. Therefore, fabrication cost of the CDR circuit is reduced. Moreover, since it is unnecessary to reserve an extra circuit layout space for the external crystal oscillator, the size of the CDR circuit is reduced.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A,B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
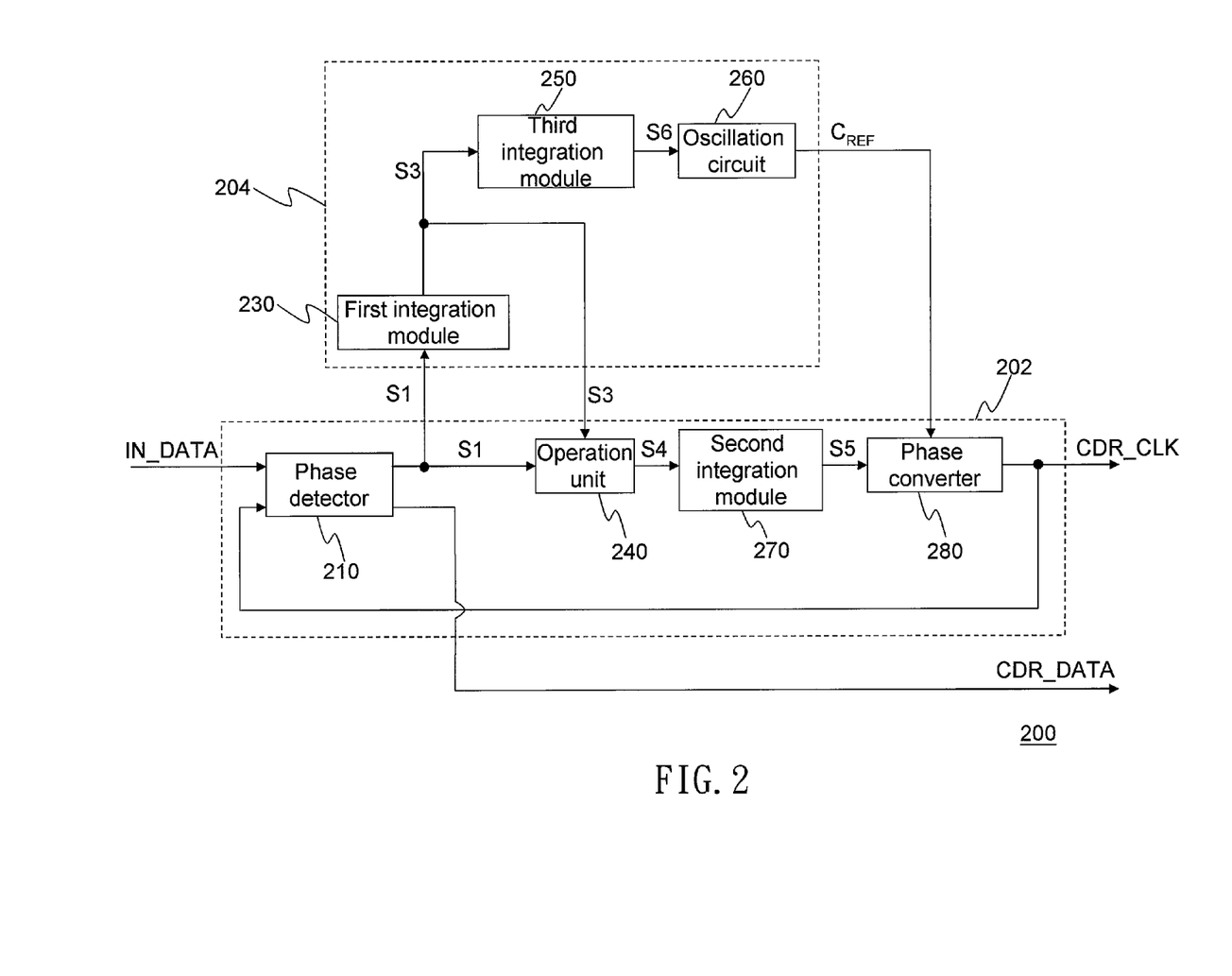
FIG. 2 to FIG. 5 are structural diagrams respectively illustrating a CDR circuit according to an exemplary embodiment of the invention.

FIG. 2 is a structural diagram of a clock and data recovery (CDR) circuit according to an exemplary embodiment of the invention. Referring to FIG. 2, the CDR circuit 200 has a phase locked module 202 and a frequency locked module 204. The phase locked module 202 is used to lock a phase of an input data stream IN_DATA to equalize the phase of the input data stream IN_DATA and a phase of a data-recovery clock CDR_CLK. Moreover, the phase locked module 202 can sample the input data stream IN_DATA according to the data-recovery clock CDR_CLK to generate a data-recovery stream CDR_DATA. In an exemplary embodiment of the invention, the CDR circuit 200 can be applied in a wire-linked communication system, and the input data stream IN_DATA can be a serial data stream, and the CDR circuit 200 can receive the input data stream IN_DATA through a single channel. However, the invention is not limited thereto, in another exemplary embodiment, the CDR circuit 200 can also be applied in a wireless communication system, and the input data stream IN_DATA can be a parallel data stream.

The frequency locked module 204 generates and outputs at least one reference clock $C_{REF}$ to the phase locked module 202 according to a phase difference between the input data stream IN_DATA and the data-recovery clock CDR_CLK. Further, the frequency locked module 204 progressively adjusts a frequency of the reference clock $C_{REF}$ to gradually close up the frequency of the reference clock $C_{REF}$ to a frequency of the input data stream IN_DATA. In this way, jitter of the reference clock $C_{REF}$ is mitigated, and an error between the frequency of the reference clock $C_{REF}$ and the frequency of the input data stream IN_DATA can be smaller than a predetermined value. In the present exemplary embodiment, in case that the frequency of the input data stream IN_DATA is 5 GHz, the error between the frequency of the reference clock $C_{REF}$ and the frequency of the input data stream IN_DATA can be smaller than 100 ppm, which is complied with a universal serial bus (USB) 3.0 specification that the error has to be smaller than 300 ppm. Therefore, according to the structure of FIG. 2, the CDR 200 can generate the required reference clock $C_{REF}$ without using an external crystal oscillator. Moreover, the frequency locked module 204 can provide a first integration phase error S3 to the phase locked module 202.

In an exemplary embodiment of the invention, the phase locked module 202 has a phase detector 210, which is used for comparing the phase of the input data stream IN_DATA with the phase of the data-recovery clock CDR_CLK to output an adjusting signal S1. The frequency locked module 204 performs a first-order integration process and a second-order integration process on the adjusting signal S1 to generate a first integration phase error S3 and a frequency control signal S6. The phase locked module 202 generates a phase control signal S5 according to the adjusting signal S1 and the first integration phase error S3. An oscillation circuit 260 of the frequency locked module 202 generates the at least one reference clock $C_{REF}$ according to the frequency control signal S6. A phase converter 280 of the phase locked module 202 outputs the data-recovery clock CDR_CLK to the phase detector 210 according to the phase control signal S5 and the reference clock $C_{REF}$.

The oscillation circuit 260 can be a voltage-controlled oscillator (VCO), a digital-controlled oscillator (DCO), or a resistor-capacitance (RC) oscillator, etc., though the invention is not limited thereto.

The adjusting signal S1 output by the phase detector 210 corresponds to a phase difference of the input data stream IN_DATA and the data-recovery clock CDR_CLK. For example, when the phase of the input data stream IN_DATA is ahead of the phase of the data-recovery clock CDR_CLK, the adjusting signal S1 has a positive voltage; when the phase of the input data stream IN_DATA falls behind the phase of the data-recovery clock CDR_CLK, the adjusting signal S1 has a negative voltage; and when the phase of the input data stream IN_DATA is equal to the phase of the data-recovery clock CDR_CLK, the adjusting signal S1 has a voltage value of 0 volt.

The frequency locked module 204 has a first integration module 230. The first integration module 230 is coupled to the phase detector 210, and performs a gain process and an integration process on the adjusting signal S1 to output the first integration phase error S3.

The phase locked module 202 further has an operation unit 240 and a second integration module 270. The operation module 240 is coupled to the phase detector 210 and the first integration module 230, and operates the first integration phase error S3 and the adjusting signal S1 to obtain an operation value S4. In an exemplary embodiment of the invention, the operation unit 240 is an adder, which calculates a sum of the adjusting signal S1 and the first integration phase error S3. In other words, S4=S1+S3. Moreover, in an exemplary embodiment of the invention, the operation unit 240 is a subtracter, which calculates a difference of the adjusting signal S1 and the first integration phase error S3. In other words, S4=S1−S3, or S4=S3−S1. Moreover, in an exemplary embodiment of the invention, the operation unit 240 is a calculator, which generates the operation value S4 according to the adjusting signal S1 and the first integration phase error S3.

The second integration module 270 is coupled to the operation unit 240, and performs an integration process on the operation value S4 to output the phase control signal S5.

In an exemplary embodiment of the invention, the frequency locked module 204 further has a third integration module 250, which is coupled to the first integration module 230, and performs an integration process on the first integration phase error S3 to output the frequency control signal S6. In an exemplary embodiment of the invention, the third integration module 250 performs a gain process on the first integration phase error S3.

The phase converter 280 of the phase locked module 202 is coupled to the oscillation circuit 260, the second integration module 270 and the phase detector 210, and outputs the data-recovery clock CDR_CLK to the phase detector 210 according to the phase control signal S5 and the reference clock $C_{REF}$.

Figure 3:
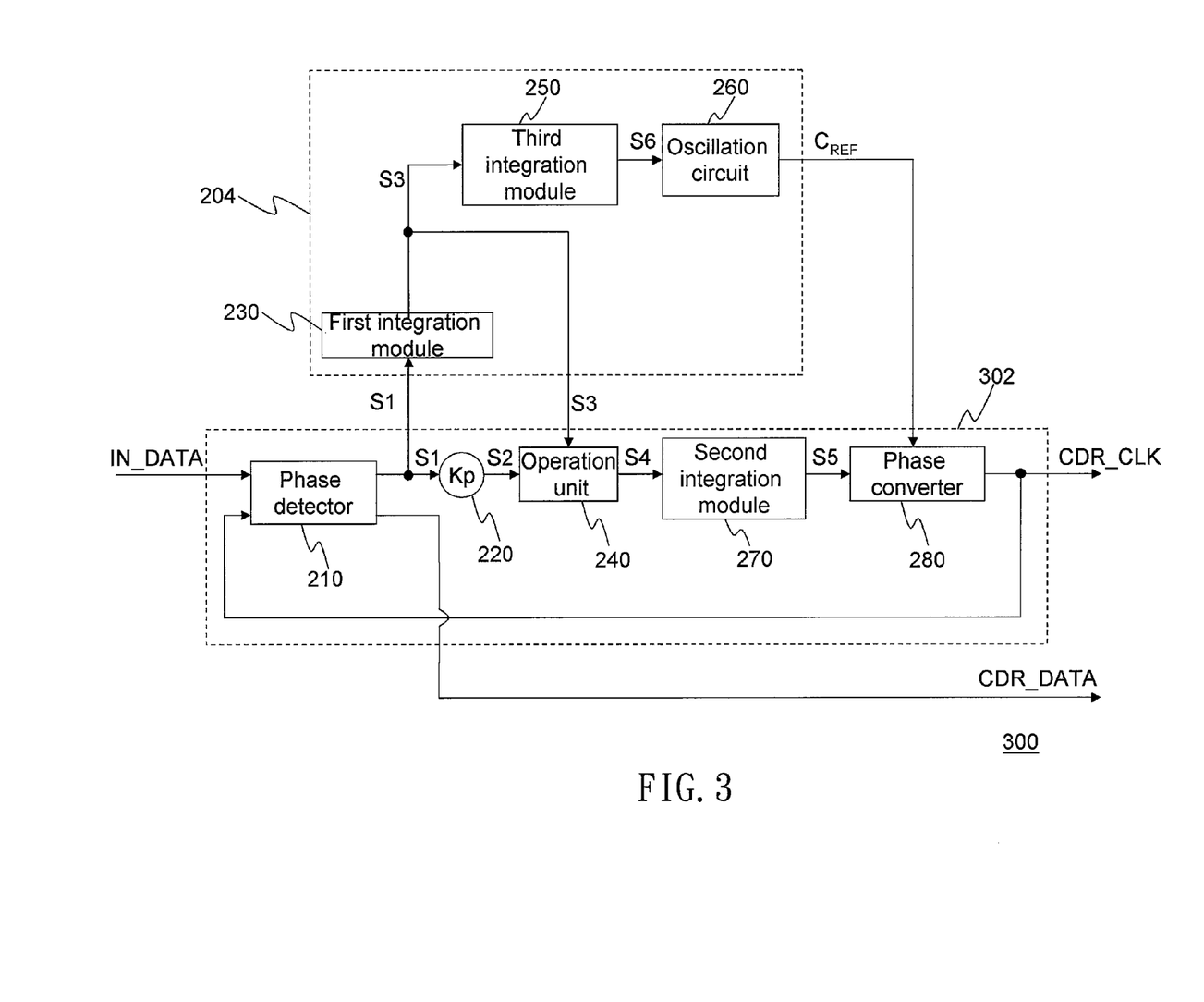

In an exemplary embodiment of the invention, the CRD circuit 200 further includes an amplifier, which is coupled between the phase detector 210 and the operation unit 240. Referring to FIG. 3, FIG. 3 is a structural diagram of a CDR circuit 300 according to an exemplary embodiment of the invention. The CDR circuit 300 has a phase locked module 302 and a frequency locked module 204. The phase locked module 302 has a same function as that of the phase locked module 202, which is used to lock the phase of the input data stream IN_DATA to equalize the phase of the input data stream IN_DATA and the phase of the data-recovery clock CDR_CLK. A difference between the phase locked module 302 and the phase locked module 202 is that the phase locked module 302 further includes the amplifier 220 coupled between the phase detector 210 and the operation unit 240. The amplifier 220 multiplies the adjusting signal S1 by a predetermined ratio Kp to output a phase error S2 to the operation unit 240. In other words, the phase error S2 is equal to the adjusting signal S1 multiplied by the predetermined ratio Kp, and the amplifier 220 outputs the adjusting signal S1 multiplied with the predetermined ratio Kp to the operation unit 240. The predetermined ratio Kp can be 100%, 150%, 80% or other values. In an exemplary embodiment, the operation unit 240 is an adder, which calculates a sum of the phase error S2 and the first integration phase error S3. In other words, S4=S2+S3. Moreover, in an exemplary embodiment of the invention, the operation unit 240 is a subtracter, which calculates a difference of the phase error S2 and the first integration phase error S3. In other words, S4=S2−S3, or S4=S3−S2. Moreover, in an exemplary embodiment of the invention, the operation unit 240 is a calculator, which generates the operation value S4 according to the phase error. S2 and the first integration phase error S3.

Figure 4:
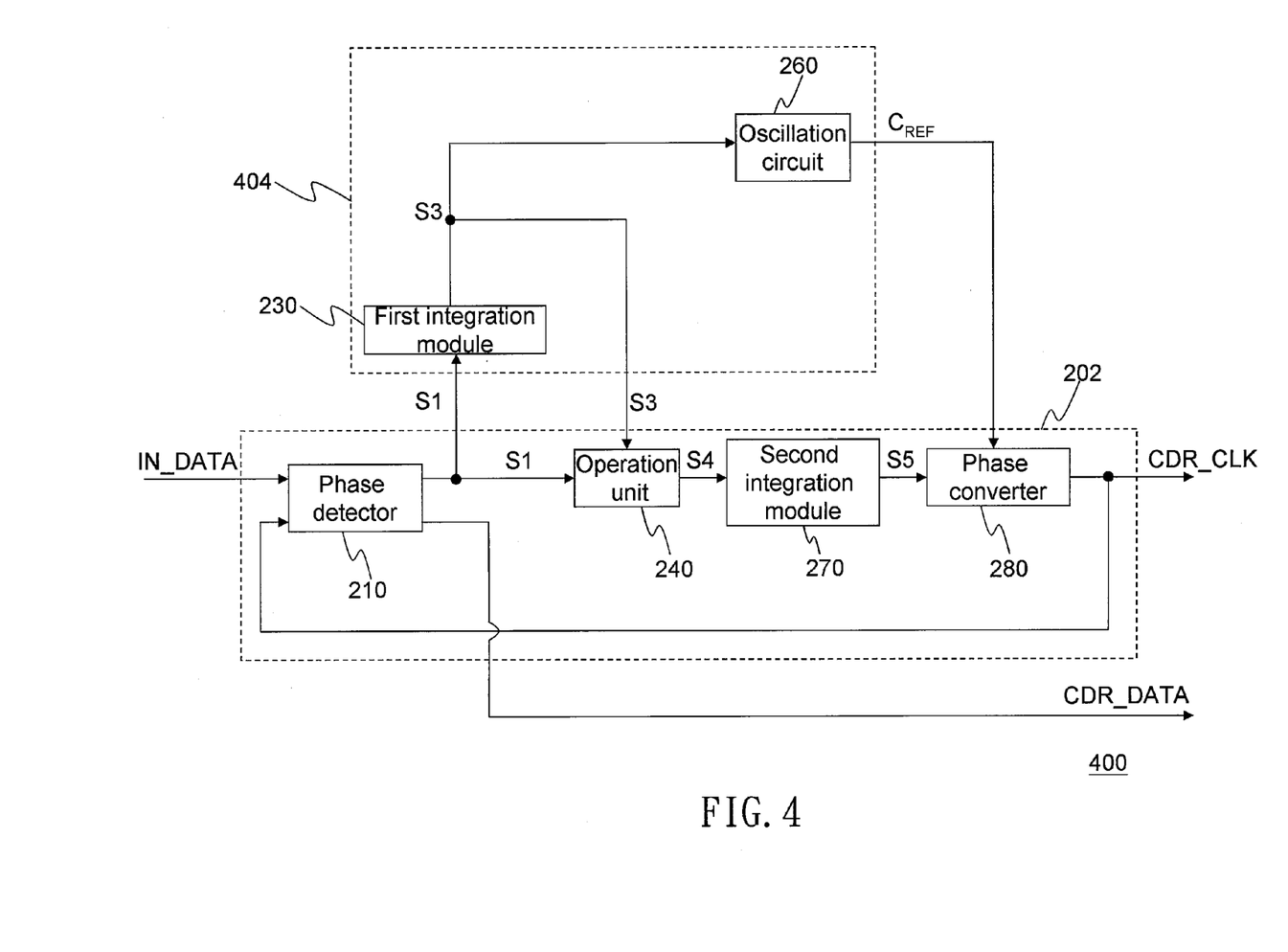

In an exemplary embodiment of the invention, the first integration phase error S3 can serve as a frequency control signal, and the oscillation circuit 260 generates the at least one reference clock $C_{REF}$ according to the first integration phase error S3. Referring to FIG. 4, FIG. 4 is a structural diagram of a CDR circuit 400 according to an exemplary embodiment of the invention. The CDR circuit 400 has the phase locked module 202 and a frequency locked module 404. The frequency locked module 404 has a function similar to that of the frequency locked module 204, which generates and outputs the at least one reference clock $C_{REF}$ to the phase locked module 202 according to the phase difference between the input data stream IN_DATA and the data-recovery clock CDR_CLK. A difference between the frequency locked module 404 and the frequency locked module 204 is that the frequency locked module 404 does not have the third integration module 250. The first integration phase error S3 of the CDR circuit 400 serves as a frequency control signal, and the oscillation circuit 260 generates the at least one reference clock $C_{REF}$ according to the first integration phase error S3.

Figure 5:
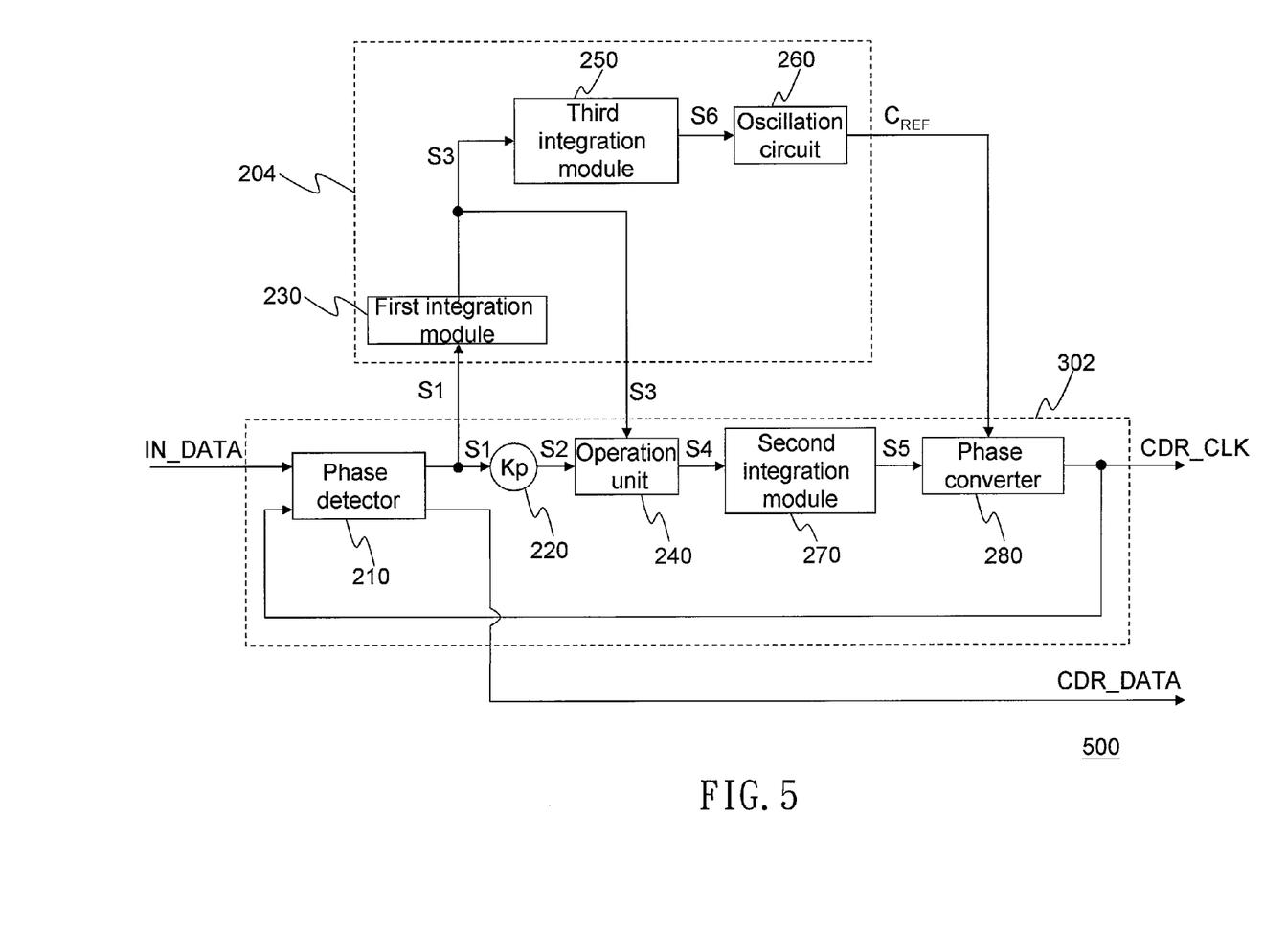

In an exemplary embodiment of the invention, the CDR circuit has the phase locked module 302 and the frequency locked module 204. Referring to FIG. 5, FIG. 5 is a structural diagram of a CDR circuit 500 according to an exemplary embodiment of the invention. The CDR circuit 500 has the phase locked module 302 and the frequency locked module 204. Therefore, in the present exemplary embodiment, the CDR circuit 500 has both of the amplifier 220 and the third integration module 250.

Figure 6A:
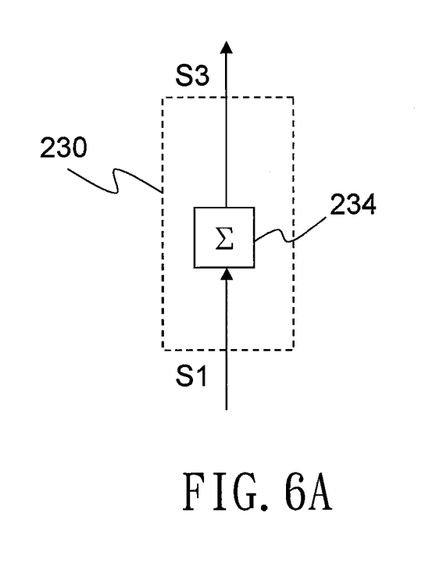
FIG. 6A to FIG. 6C are schematic diagrams respectively illustrating a first integration module according to an exemplary embodiment of the invention.

Referring to FIG. 6A, in an exemplary embodiment of the invention, the first integration module 230 has an integrator 234, which performs the integration process on the adjusting signal S1 to output the first integration phase error S3.

Figure 6B:
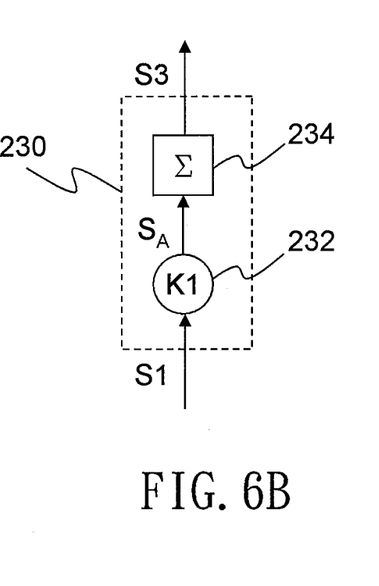

In an exemplary embodiment of the invention, the first integration module 230 may include an amplifier and the integrator. Referring to FIG. 6B, FIG. 6B is a schematic diagram of the first integration module 230 according to an exemplary embodiment of the invention. The first integration module 230 includes an amplifier 232 and the integrator 234. The amplifier 232 is coupled to the phase detector 210, and multiplies the adjusting signal S1 by a first gain K1 to output a phase error $S_A$. The integrator 230 is coupled to the amplifier 232, and performs the integration process on the phase error $S_A$ to output the first integration phase error S3.

Figure 6C:
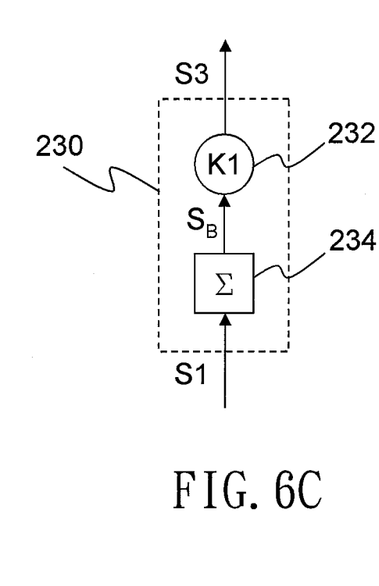

In an exemplary embodiment of the invention, configuration positions of the amplifier 232 and the integrator 234 can be exchanged. Referring to FIG. 6C, FIG. 6C is a schematic diagram of the first integration module 230 according to an exemplary embodiment of the invention. The integrator 234 is coupled to the phase detector 210, and performs the integration process on the adjusting signal S1 to output an integration signal $S_B$. The amplifier 232 is coupled to the integrator 234, and multiplies the integration signal $S_B$ by the first gain K1 to output the first integration phase error S3.

Figure 7A:
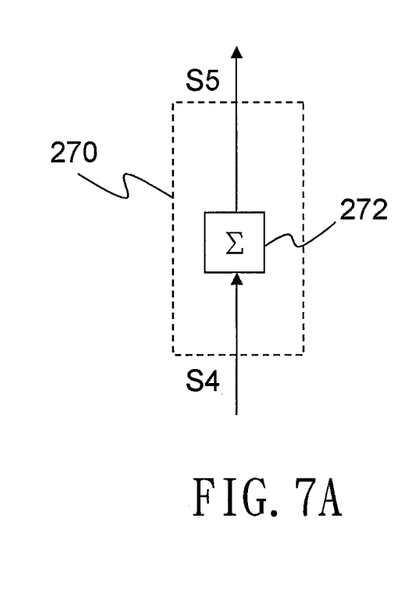
FIG. 7A to FIG. 7C are schematic diagrams respectively illustrating a second integration module according to an exemplary embodiment of the invention.

Referring to FIG. 7A, in an exemplary embodiment of the invention, the second integration module 270 has an integrator 272, which performs the integration process on the operation value S4 to output the phase control signal S5.

Figure 7B:
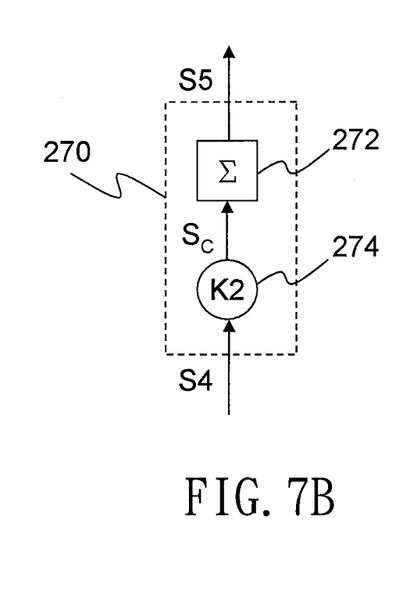

Referring to FIG. 7B, in an exemplary embodiment of the invention, the second integration module 270 has an amplifier 274 and the integrator 272. The amplifier 274 is coupled to the operation unit 240, and multiplies the operation value S4 by a second gain K2 to output a gained operation value $S_C$. The integrator 272 is coupled to the amplifier 274, which performs the integration process on the gained operation value $S_C$ to output the phase control signal S5.

Figure 7C:
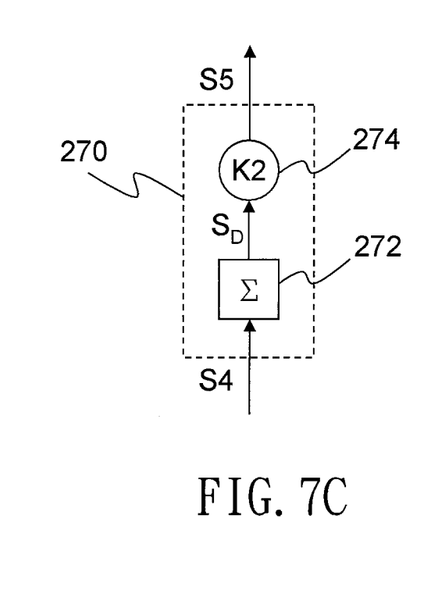

In an exemplary embodiment of the invention, configuration positions of the amplifier 274 and the integrator 272 can be exchanged. Referring to FIG. 7C, FIG. 7C is a schematic diagram of the second integration module 270 according to an exemplary embodiment of the invention. The integrator 272 is coupled to the operation unit 240, and performs the integration process on the operation value S4 to output an integration signal $S_D$. The amplifier 274 is coupled to the integrator 272, and multiplies the integration signal $S_D$ by the second gain K2 to output the phase control signal S5.

Figure 8A:
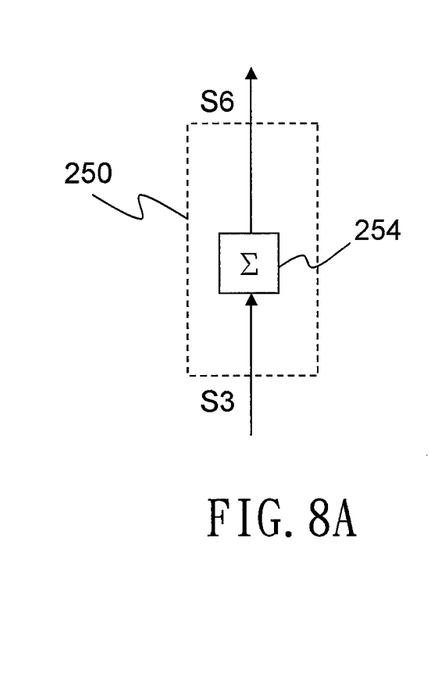
FIG. 8A to FIG. 8C are schematic diagrams respectively illustrating a third integration module according to an exemplary embodiment of the invention.

Referring to FIG. 8A, in an exemplary embodiment of the invention, the third integration module 250 has an integrator 254, which performs the integration process on the first integration phase error S3 to output the frequency control signal S6.

Figure 8B:
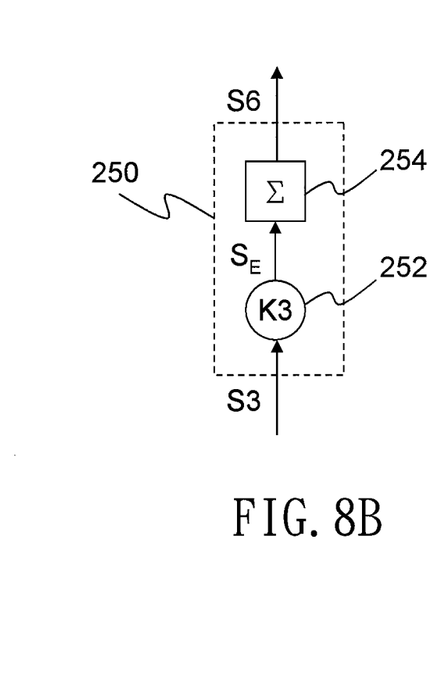

In an exemplary embodiment of the invention, the third integration module 250 may include an amplifier and the integrator. Referring to FIG. 8B, FIG. 8B is a schematic diagram of the third integration module 250 according to an exemplary embodiment of the invention. The third integration module 250 includes an amplifier 252 and the integrator 254. The amplifier 252 is coupled to the first integration module 230, and multiplies the first integration phase error S3 by a third gain K3 to output a second integration phase error $S_E$. The integrator 254 is coupled to the amplifier 252, which performs the integration process on the second integration phase error $S_E$ to output the frequency control signal S6.

Figure 8C:
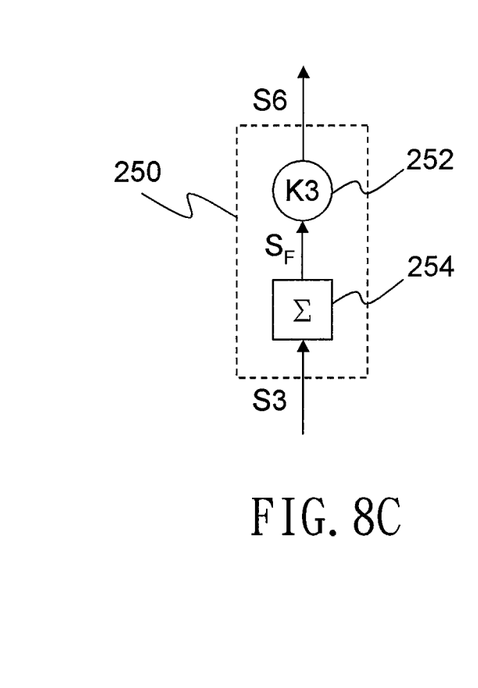

In an exemplary embodiment of the invention, configuration positions of the amplifier 252 and the integrator 254 can be exchanged. Referring to FIG. 8C, FIG. 8C is a schematic diagram of the third integration module 250 according to an exemplary embodiment of the invention. The integrator 254 is coupled to the first integration module 230, and performs the integration process on the first integration phase error S3 to output an integration signal $S_F$. The amplifier 252 is coupled to the integrator 254, and multiplies the integration signal $S_F$ by the third gain K3 to output the frequency control signal S6.

In an exemplary embodiment of the invention, the oscillation circuit 260 generates the single reference clock $C_{REF}$, and the phase converter 280 adjusts a frequency of the reference clock $C_{REF}$ according to the phase control signal S5, so as to generate the data-recovery clock CDR_CLK.

Figure 9:
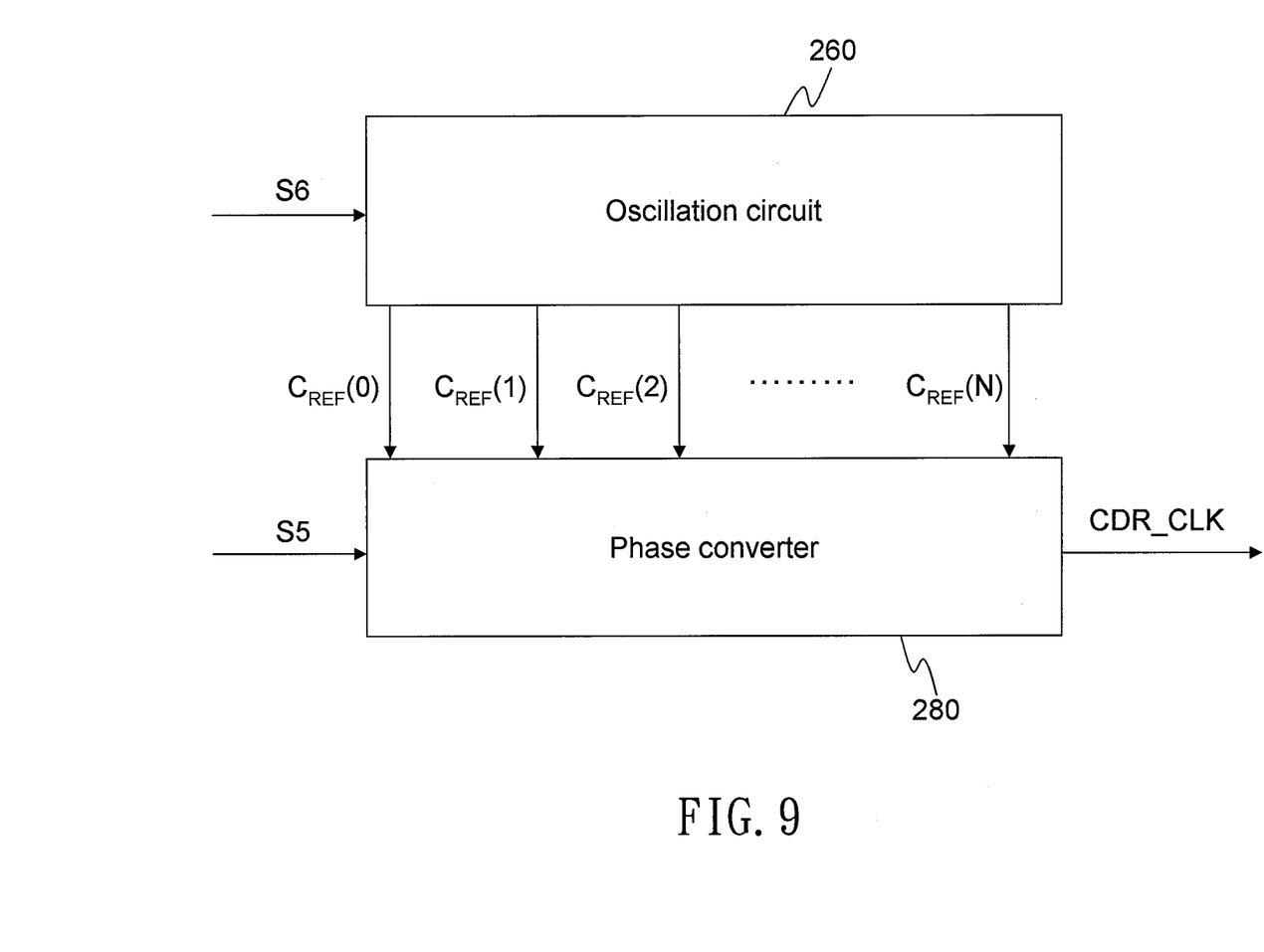
FIG. 9 is a schematic diagram of an oscillation circuit and a phase converter of a CDR circuit according to an exemplary embodiment of the invention.
Figure 10:
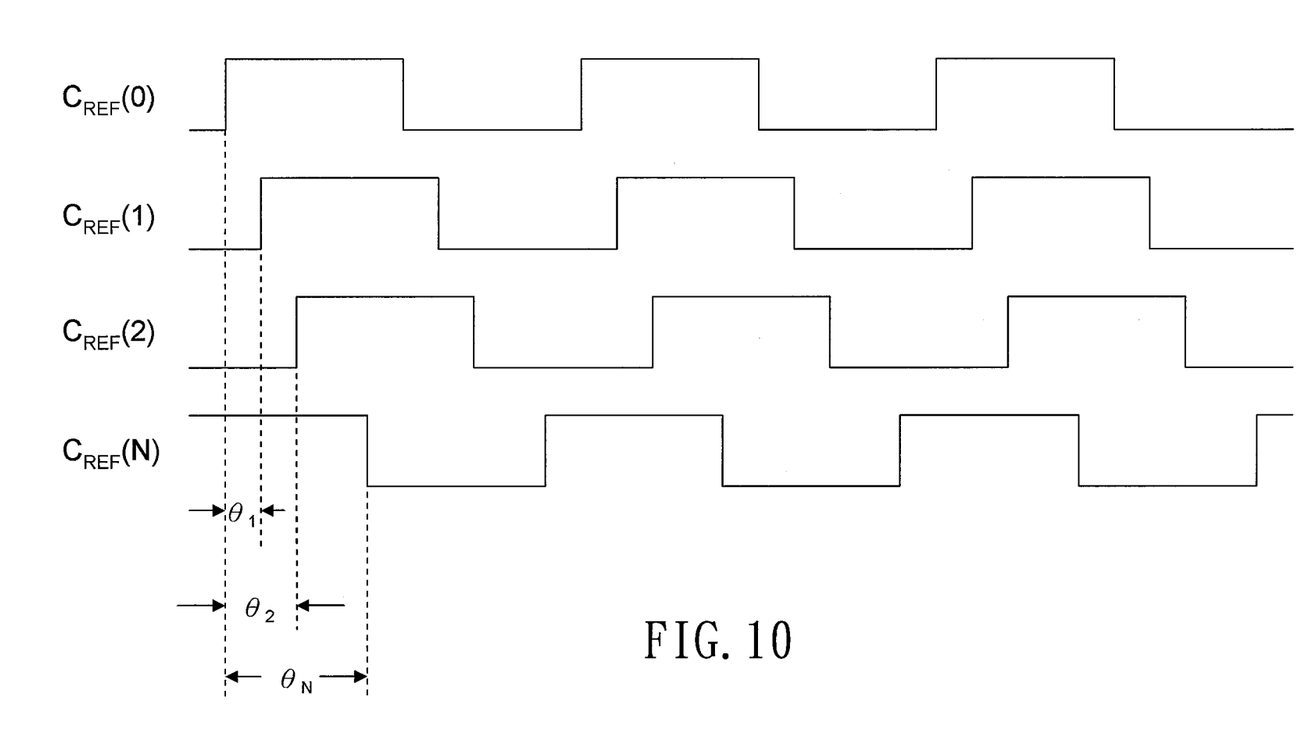
FIG. 10 is a timing diagram of a plurality of reference clocks of FIG. 9.

Moreover, in an exemplary embodiment of the invention, the oscillation circuit 260 can generate a plurality of reference clocks. Referring to FIG. 9 and FIG. 10, FIG. 9 is a schematic diagram of an oscillation circuit and a phase converter of a CDR circuit according to an exemplary embodiment of the invention, and FIG. 10 is a timing diagram of a plurality of reference clocks of FIG. 9. The oscillation circuit 260 generates a plurality of reference clocks $C_{REF}(0)$-$C_{REF}(N)$ according to the frequency control signal S6. The reference clocks $C_{REF}(0)$-$C_{REF}(N)$ have the same frequency, though phases thereof are different. As shown in FIG. 10, a phase difference between the reference clocks $C_{REF}(0)$ and $C_{REF}(1)$ is $\theta_1$, a phase difference between the reference clocks $C_{REF}(0)$ and $C_{REF}(2)$ is $\theta_2$, and a phase difference between the reference clocks $C_{REF}(0)$ and $C_{REF}(N)$ is $\theta_N$.

In an exemplary embodiment of the invention, the phase converter 280 is a phase selector, which selects one of the reference clocks $C_{REF}(0)$-$C_{REF}(N)$ to serve as the data-recovery clock CDR_CLK according to the phase control signal S5.

In an exemplary embodiment of the invention, the phase converter 280 is a phase interpolator, which performs a phase interpolation process on the reference clocks $C_{REF}(0)$-$C_{REF}(N)$ according to the phase control signal S5, so as to output the data-recovery clock CDR_CLK. When the phase converter 280 performs the phase interpolation process on the reference clocks $C_{REF}(0)$-$C_{REF}(N)$, it may first select any two reference clocks from the reference clocks $C_{REF}(0)$-$C_{REF}(N)$, and then generates the data-recovery clock CDR_CLK according to the two selected reference clocks, and the phase of the data-recovery clock CDR_CLK is between the phases of the two selected reference clocks.

Figure 11:
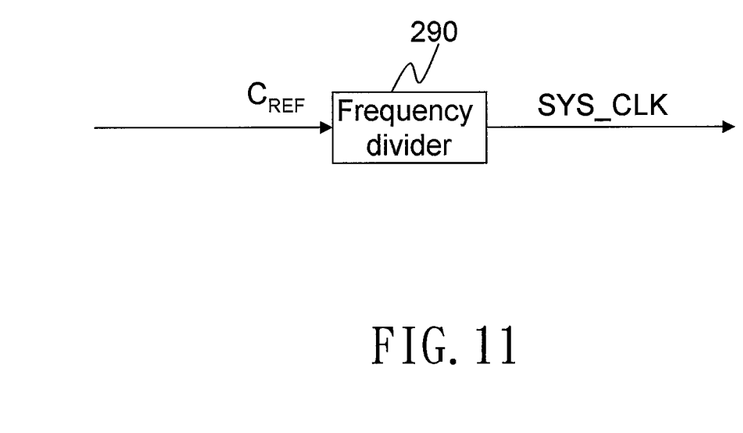
FIG. 11 is a schematic diagram of a frequency divider of a CDR circuit according to an exemplary embodiment of the invention.

Referring to FIG. 11, in an exemplary embodiment of the invention, the CDR circuit further has a frequency divider 290, which is used to divide a frequency of the reference clock $C_{REF}$ to generate a system clock SYS_CLK with a frequency smaller than that of the reference clock $C_{REF}$. The system clock SYS_CLK can be used by other electronic elements of an electronic device containing the CDR circuit 200, so that these electronic elements can operate according to the system clock SYS_CLK. It should be noticed that in the embodiment that the oscillation circuit 260 generate a plurality of reference clocks, the frequency divider 290 can divides the frequency of one of the reference clocks $C_{REF}(0)$-$C_{REF}(N)$, so as to generate the system clock SYS_CLK.

Figure 12:
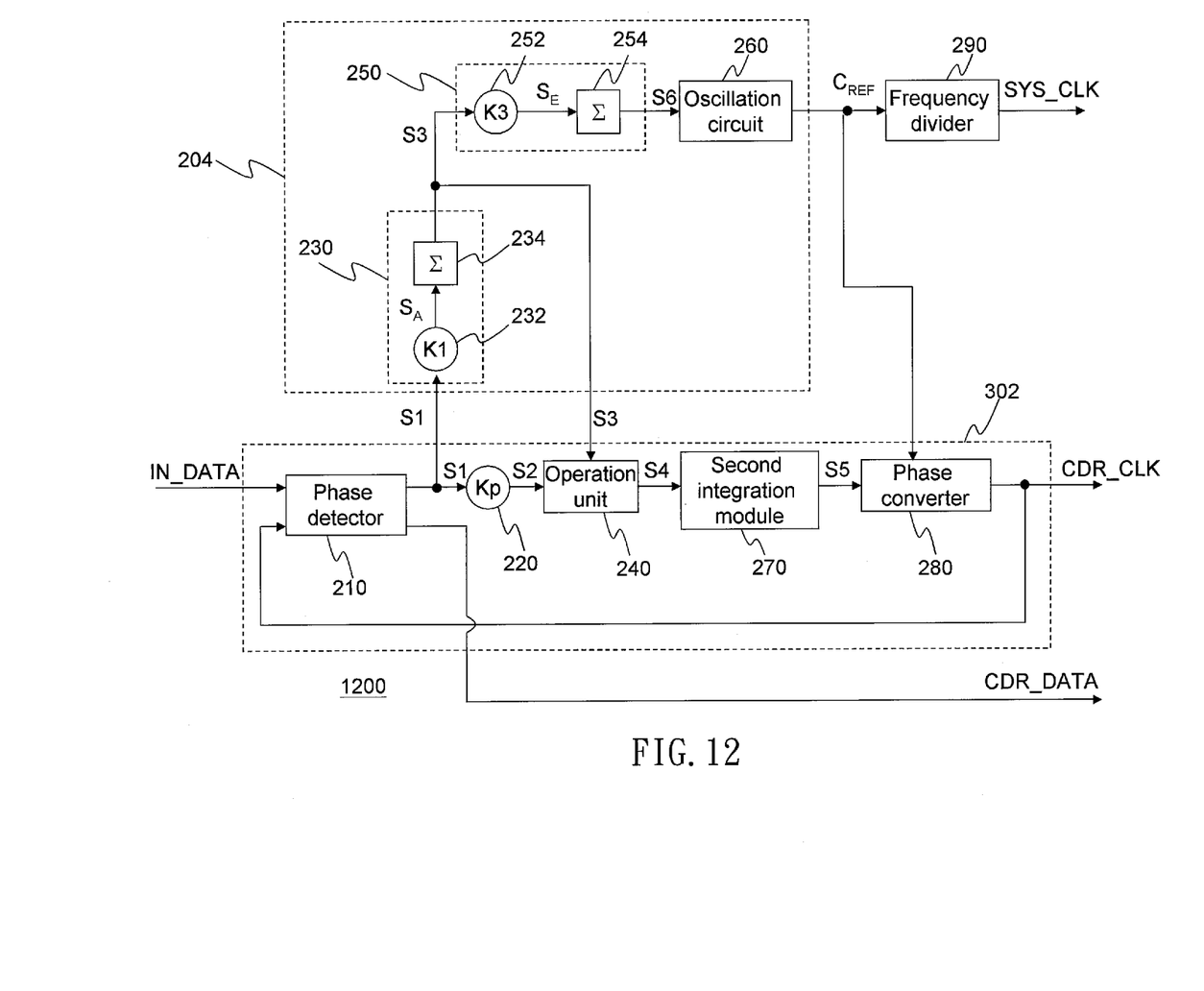
FIG. 12 is structural diagram of a CDR circuit according to an exemplary embodiment of the invention.

Referring to FIG. 12, FIG. 12 is structural diagram of a CDR circuit 1200 according to an exemplary embodiment of the invention. The CDR circuit 1200 has the phase locked module 302 and the frequency locked module 204. In the present exemplary embodiment, the first integration module 230 of the frequency locked module 204 is implemented by the first integration module 230 of FIG. 6A, and the third integration module 250 of the frequency locked module 204 is implemented by the third integration module 250 of FIG. 8A. In the present exemplary embodiment, a bandwidth of the phase locked module 202 can be limited by adjusting the predetermined ratio Kp. Generally, the bandwidth of the phase locked module 202 is between 1.5 MHz and 5.0 MHz. For example, if the CDR circuit 200 is complied with the USB 3.0 specification, the bandwidth of the phase locked module 202 can be limited to 5 MHz by adjusting the predetermined ratio Kp. In this way, the phase locked module 202 can be used to filter a high-frequency noise of the input data stream IN_DATA, and it avails tracking a phase variation of a middle-to-low frequency part of the data-recovery clock CDR_CLK. Moreover, in an exemplary embodiment of the invention, the amplifier 220 can be a programmable amplifier, and a control signal can be transmitted to the amplifier 220 to adjust the predetermined ratio Kp.

Moreover, the first gain K1 and the third gain K3 can also be adjusted. A magnitude of the third gain K3 can determine a variation speed of the frequency of the reference clock $C_{REF}$. In detail, in an exemplary embodiment of the invention, the greater the third gain K3 is, the faster a frequency variation of the reference clock $C_{REF}$ is. Comparatively, the smaller the third gain K3 is, the slower the frequency variation of the reference clock $C_{REF}$ is. Moreover, a bandwidth of the frequency locked module 204 can be set to a value smaller than the bandwidth of the phase locked module 202, so as to filter a high-frequency jitter noise in the input data stream IN_DATA, and avoid interfering a phase locking operation performed by the phase locked module 202. In an exemplary embodiment of the invention, the bandwidth of the frequency locked module 204 is set between 1 KHz and 100 KMz, and the bandwidth of the phase locked module 202 is set between 1.5 MHz and 5.0 MHz.

Besides comparing the phase of the input data stream IN_DATA and the phase of the data-recovery clock CDR_CLK, the phase detector 210 further samples the input data stream IN_DATA according to the data-recovery clock CDR_CLK to generate a data-recovery stream CDR_DATA. The data-recovery stream CDR_DATA includes the received data. In an exemplary embodiment of the invention, a post end circuit of the CDR circuit 200 can read the data of the data-recovery stream CDR_DATA according to the data-recovery clock CDR_CLK.

In summary, the CDR circuit of the invention is capable of generating the required reference clock according to the received input data stream without using an external crystal oscillator. Therefore, fabrication cost of the CDR circuit is reduced. Moreover, since it is unnecessary to reserve an extra circuit layout space for the external crystal oscillator, the size of the CDR circuit is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clock and data recovery circuit, comprising:
   a phase detector, comparing a phase of an input data stream with a phase of a data-recovery clock to output an adjusting signal;
   a first integration module, coupled to the phase detector, and performing an integration process on the adjusting signal to output a first integration phase error;
   an operation unit, coupled to the first integration module, and operating the first integration phase error and the adjusting signal to obtain an operation value;
   a second integration module, coupled to the operation unit, and performing an integration process on the operation value to output a phase control signal;
   a third integration module, coupled to the first integration module, and performing an integration process on the first integration phase error to output a frequency control signal;
   an oscillation circuit, coupled to the third integration module, and generating at least one reference clock according to the frequency control signal; and
   a phase converter, coupled to the oscillation circuit, the second integration module and the phase detector, and outputting the data-recovery clock to the phase detector according to the phase control signal and the reference clock.

2. The clock and data recovery circuit as claimed in claim 1, further comprising an amplifier coupled between the phase detector and the operation unit for multiplying the adjusting signal by a predetermined ratio, so as to output the adjusting signal multiplied with the predetermined ratio to the operation unit.

3. The clock and data recovery circuit as claimed in claim 1, wherein at least one integration module of the first integration module, the second integration module and the third integration module comprises an amplifier and an integrator for respectively performing a gain process and an integration process on an input of the at least one integration module.

4. The clock and data recovery circuit as claimed in claim 1, wherein at least one integration module of the first integration module, the second integration module and the third integration module comprises an integrator for performing an integration process on an input of the at least one integration module.

5. The clock and data recovery circuit as claimed in claim 1, further comprising a frequency divider coupled to the oscillation circuit for dividing a frequency of the reference clock to generate a system clock.

6. The clock and data recovery circuit as claimed in claim 1, wherein the phase detector samples the input data stream according to the data-recovery clock to output a data-recovery stream.

7. The clock and data recovery circuit as claimed in claim 1, wherein the input data stream is a serial data stream.

8. The clock and data recovery circuit as claimed in claim 1, wherein the oscillation circuit generates a plurality of reference clocks with a same frequency and different phases according to the frequency control signal, and the phase converter is a phase selector for selecting the data-recovery clock from the reference clocks according to the phase control signal.

9. The clock and data recovery circuit as claimed in claim 1, wherein the oscillation circuit generates a plurality of reference clocks with a same frequency and different phases according to the frequency control signal, and the phase converter is a phase interpolator for performing a phase interpolation process on the reference clocks according to the phase control signal, so as to output the data-recovery clock.

10. A clock and data recovery circuit, comprising:
    a phase detector, comparing a phase of an input data stream with a phase of a data-recovery clock to output an adjusting signal;
    a first integration module, coupled to the phase detector, and performing an integration process on the adjusting signal to output a first integration phase error;
    an operation unit, coupled to the first integration module, and operating the first integration phase error and the adjusting signal to obtain an operation value;
    a second integration module, coupled to the operation unit, and performing an integration process on the operation value to output a phase control signal;
    an oscillation circuit, coupled to the second integration module, and generating at least one reference clock according to the first integration phase error; and
    a phase converter, coupled to the oscillation circuit, the second integration module and the phase detector, and outputting the data-recovery clock to the phase detector according to the phase control signal and the reference clock.

11. The clock and data recovery circuit as claimed in claim 10, further comprising an amplifier coupled between the phase detector and the operation unit for multiplying the adjusting signal by a predetermined ratio, so as to output the adjusting signal multiplied with the predetermined ratio to the operation unit.

12. The clock and data recovery circuit as claimed in claim 10, wherein at least one integration module of the first integration module and the second integration module comprises an amplifier and an integrator for respectively performing a gain process and an integration process on an input of the at least one integration module.

13. The clock and data recovery circuit as claimed in claim 10, wherein at least one integration module of the first integration module and the second integration module comprises an integrator for performing an integration process on an input of the at least one integration module.

14. The clock and data recovery circuit as claimed in claim 10, further comprising a frequency divider coupled to the oscillation circuit for dividing a frequency of the reference clock to generate a system clock.

15. The clock and data recovery circuit as claimed in claim 10, wherein the phase detector samples the input data stream according to the data-recovery clock to output a data-recovery stream.

16. The clock and data recovery circuit as claimed in claim 10, wherein the input data stream is a serial data stream.

17. The clock and data recovery circuit as claimed in claim 10, wherein the oscillation circuit generates a plurality of reference clocks with a same frequency and different phases according to the first integration phase error, and the phase converter is a phase selector for selecting the data-recovery clock from the reference clocks according to the phase control signal.

18. The clock and data recovery circuit as claimed in claim 10, wherein the oscillation circuit generates a plurality of reference clocks with a same frequency and different phases according to the first integration phase error, and the phase converter is a phase interpolator for performing a phase interpolation process on the reference clocks according to the phase control signal, so as to output the data-recovery clock.

* * * * *